US012787840B2

(12) United States Patent
Kawai et al.

(10) Patent No.: US 12,787,840 B2
(45) Date of Patent: Nov. 3, 2026

(54) POSITION ALIGNMENT DEVICE, POSITION ALIGNMENT METHOD, BONDING DEVICE, BONDING METHOD, AND METHOD FOR MANUFACTURING SEMICONDUCTOR DEVICE

(71) Applicant: CANON MACHINERY INC., Shiga (JP)

(72) Inventors: Shinya Kawai, Shiga (JP); Yusuke Kubota, Shiga (JP)

(73) Assignee: CANON MACHINERY INC., Shiga (JP)

(*) Notice: Subject to any disclaimer, the term of this patent is extended or adjusted under 35 U.S.C. 154(b) by 307 days.

(21) Appl. No.: 18/832,668

(22) PCT Filed: Oct. 28, 2022

(86) PCT No.: PCT/JP2022/040438
§ 371 (c)(1),
(2) Date: Jul. 24, 2024

(87) PCT Pub. No.: WO2023/188500
PCT Pub. Date: Oct. 5, 2023

(65) Prior Publication Data

US 2025/0149498 A1 May 8, 2025

(30) Foreign Application Priority Data

Mar. 29, 2022 (JP) ................................ 2022-053227

(51) Int. Cl.
*H10W 72/00* (2026.01)

(52) U.S. Cl.
CPC ...... *H10W 72/0711* (2026.01); *H10W 72/073* (2026.01); *H10W 72/07178* (2026.01); *H10W 72/07323* (2026.01); *H10W 72/07338* (2026.01)

(58) Field of Classification Search
CPC ..... H05K 13/04; H05K 13/08; H10W 72/071; H10W 72/0711; H10W 72/07178;
(Continued)

(56) References Cited

U.S. PATENT DOCUMENTS 6,205,636 B1 3/2001 Abe et al.
7,200,926 B2 * 4/2007 Fukunaga .......... H05K 13/0812 29/840
(Continued)

FOREIGN PATENT DOCUMENTS

JP 2000-79517 3/2000
JP 2005-277273 10/2005
(Continued)

OTHER PUBLICATIONS

International Search Report issued Jan. 17, 2023 in International Application No. PCT/JP2022/040438.

*Primary Examiner* — Shahan Ur Rahaman
(74) *Attorney, Agent, or Firm* — Wenderoth, Lind & Ponack, L.L.P.

(57) ABSTRACT

Provided is a position alignment device including: a positional relationship detector configured to detect a positional relationship between a target mark position registered by a pickup-side registration part and a target mark position registered by a bonding-side registration part; a pickup-side offset amount detector configured to detect an offset amount of offset between a target mark position in an image taken by a pickup-side imaging part and the target mark position registered by the pickup-side registration part; and a position adjuster configured to adjust a bonding position, based on the offset amount detected by the pickup-side offset amount detector, an offset amount detected by a bonding-side offset amount detector, and the positional relationship detected by the positional relationship detector.

7 Claims, 5 Drawing Sheets

(58) Field of Classification Search
CPC ......... H10W 72/073; H10W 72/07323; H10W 72/07338; H10W 72/30
See application file for complete search history.

(56) References Cited

U.S. PATENT DOCUMENTS

| | | | | |
|---|---|---|---|---|
| 10,861,819 | B1 | 12/2020 | Deng et al. | |
| 2018/0126718 | A1* | 5/2018 | Woo | B32B 37/06 |

FOREIGN PATENT DOCUMENTS

| | | | | |
|---|---|---|---|---|
| JP | 2010-41001 | | 2/2010 | |
| JP | 2010-541293 | | 12/2010 | |
| JP | 2016-171107 | | 9/2016 | |
| JP | 2016171107 | A * | 9/2016 | H10W 95/00 |
| JP | 2016-197629 | | 11/2016 | |
| JP | 2016-197630 | | 11/2016 | |

* cited by examiner

POSITION ALIGNMENT DEVICE, POSITION ALIGNMENT METHOD, BONDING DEVICE, BONDING METHOD, AND METHOD FOR MANUFACTURING SEMICONDUCTOR DEVICE

TECHNICAL FIELD

The present invention relates to a position alignment device, a position alignment method, a bonding device, a bonding method, and a method of manufacturing a semiconductor device.

BACKGROUND ART

In manufacture of a semiconductor device (which refers to a device that functions by utilizing semiconductor characteristics in general and an electro-optical device, a semiconductor circuit, and an electronic device correspond to the semiconductor device), there is adopted a chip bonding technique in which a wafer having a large number of elements collectively formed therein is diced and separated into individual semiconductor chips, and those semiconductor chips are bonded one by one to a predetermined position of a lead frame or the like. Further, this chip bonding uses a die bonder (bonding device).

The bonding device includes a bonding arm including a collet configured to suction a semiconductor chip of a supply portion, a recognition camera used to observe the semiconductor chip of the supply portion, and a recognition camera used to observe an island portion of a lead frame at a bonding position.

The supply portion includes a semiconductor wafer, and the semiconductor wafer is divided into a large number of semiconductor chips. That is, the wafer is bonded to a pressure-sensitive adhesive sheet (dicing sheet), and this dicing sheet is held by an annular frame. Then, the wafer bonded on this dicing sheet is singulated with the use of a circular blade (dicing saw) or the like to form the chips. Further, the bonding arm holding the collet can move between a pickup position and the bonding position via a transporting mechanism.

Further, the chip is vacuum-suctioned onto this collet through a suction hole opened through a lower end surface of the collet, and the chip is suctioned onto the lower end surface of this collet. When this vacuum suction (evacuation) is released, the chip is separated from the collet.

Next, a die bonding method using this die bonder is described. First, the chip to be picked up is observed by the recognition camera arranged above the supply portion. After the collet is positioned above this chip to be picked up, the collet is moved downward so as to pick up this chip. After that, the collet is moved upward.

Next, the island portion of the lead frame to be subjected to bonding is observed by the recognition camera arranged above the bonding position. After the collet is moved in a direction indicated by the arrow so as to be positioned above this island portion, the collet is moved downward so as to supply the chip to this island portion. Further, after the chip is supplied to the island portion, the collet is moved upward, and then the collet is returned to a standby position above the pickup position.

Incidentally, there is a type of chip that has a rear surface to which a die attach film (DAF) for adhesion to a supplied-to member such as a lead frame or a substrate is attached. The die attach film is an adhesive in the form of a film, and cures by being heated. That is, at the bonding position, the supplied-to member is placed on a stage including a heating part (for example, a heater) and the chip is bonded to the supplied-to member heated to a predetermined temperature. Thus, the chip is bonded to the supplied-to member via the die attach film.

However, with a die bonder including a heating part such as this, thermal deformation of a bonding head, a recognition camera attaching portion, or the like from heating by the heating part causes misalignment of a chip mounting position in some cases. Accordingly, various devices configured to correct misalignment of a chip mounting position have hitherto been proposed (Patent Literature 1 and Patent Literature 2).

In Patent Literature 1, there are described a bonding device and a bonding method that achieve high accuracy of positioning at a packaging position by correcting a mismatch in posture between a pickup imaging camera and a packaging imaging camera. This device includes a pickup imaging part, a placed position imaging part, a die transfer tool, a first examination part, a second examination part, and a correction part. An image of a reference mark can be taken by the pickup imaging part or the placed position imaging part via an optical system which is provided in the die transfer tool and which includes two prisms. The two prisms are supported to the die transfer tool by an optical system support portion, and a first prism out of the two prisms which is provided so as to face the pickup imaging part or the placed position imaging part is provided so that an optical axis of the first prism matches a central axis of the die transfer tool. A second prism out of the two prisms which is provided so as to face the reference mark is provided so as to face the first prism.

In Patent Literature 2, there is described a method for picking up and packaging a semiconductor chip that ensures highly accurate placement irrespective of external situations and changes. In this method, a position of a semiconductor chip to be packaged that is detected by a first camera is supplied in the form of position data associated with a first coordinate system, a position of a place in a substrate at which the semiconductor chip is to be packaged is supplied in the form of position data associated with a second coordinate system, and a position of a bonding head is associated with a third coordinate system.

CITATION LIST

Patent Literature 1: JP-2016-171107 A
Patent Literature 2: JP-2010-541293 A

SUMMARY OF INVENTION

Technical Problem

In the device as described in Patent Literature 1, the correction part corrects a mismatch in posture between a die and a bonding arm as well as a mismatch in posture between a substrate and the die. That is, the device is not aimed for position alignment. It is accordingly required to match the optical axis of the first prism facing the pickup imaging part or the placed position imaging part with the central axis of the die transfer tool, and to provide the second prism facing the reference mark so as to face the first prism. Thus, a configuration of the device becomes complicated, and high assembly accuracy is also required. In addition, a plurality of arithmetic operations are required.

The method as described in Patent Literature 2 requires a plurality of arithmetic operations for position alignment.

There are accordingly a plurality of parameters, and one incorrect parameter may impair accuracy of this position alignment processing.

In view of the problems described above, the present invention provides a position alignment device, a position alignment method, a bonding device, a bonding method, and a method of manufacturing a semiconductor device, each of which enables accurate position alignment by simple processing.

Solution to Problem

According to the present invention, there is provided a position alignment device comprising: a target mark provided on a bonding arm; a pickup-side imaging part configured to take an image of a pickup position; a bonding-side imaging part configured to take an image of a bonding position; a pickup-side registration part configured to register a target mark position in a taken image screen of the pickup-side imaging part; a bonding-side registration part configured to register a target mark position in a taken image screen of the bonding-side imaging part; a positional relationship detector configured to detect a positional relationship between the target mark position registered by the pickup-side registration part and the target mark position registered by the bonding-side registration part; a pickup-side offset amount detector configured to detect an offset amount of offset between a target mark position in an image taken by the pickup-side imaging part and the target mark position registered by the pickup-side registration part; a bonding-side offset amount detector configured to detect an offset amount of offset from the target mark position registered by the bonding-side registration part; and a position adjuster configured to adjust bonding coordinates, based on the offset amount detected by the pickup-side offset amount detector, the offset amount detected by the bonding-side offset amount detector, and the positional relationship detected by the positional relationship detector, wherein the registered target mark position is displayed at a position offset from a center in a pickup taken image screen, and the registered target mark position is displayed at a position offset from a center in a bonding taken image screen. To “adjust the bonding coordinates” means to place the target mark position in the taken image screen on the pickup side and the target mark position in the taken image screen on the bonding side at the same coordinates in the respective taken image screens. The amounts of offset of the registered positions of the target mark from the centers in the taken image screens here are each outside at least a range of errors that occur due to design, manufacture, and assembly. That is, the amounts of offset of the registered positions of the target mark from the centers in the taken image screens are each larger than an amount of offset caused by those errors, and the amounts of offset of the registered positions of the target mark from the centers in the taken image screens are each set so as to be outside a tolerable range of errors of the device that occur when measures to prevent the registered positions from being offset are taken.

Advantageous Effects of Invention

The present invention enables accurate position alignment by simple processing, regardless of thermal deformation.

DESCRIPTION OF EMBODIMENTS

An embodiment of the present invention is described below with reference to FIG. 1 to FIG. 6.

Figure 2:
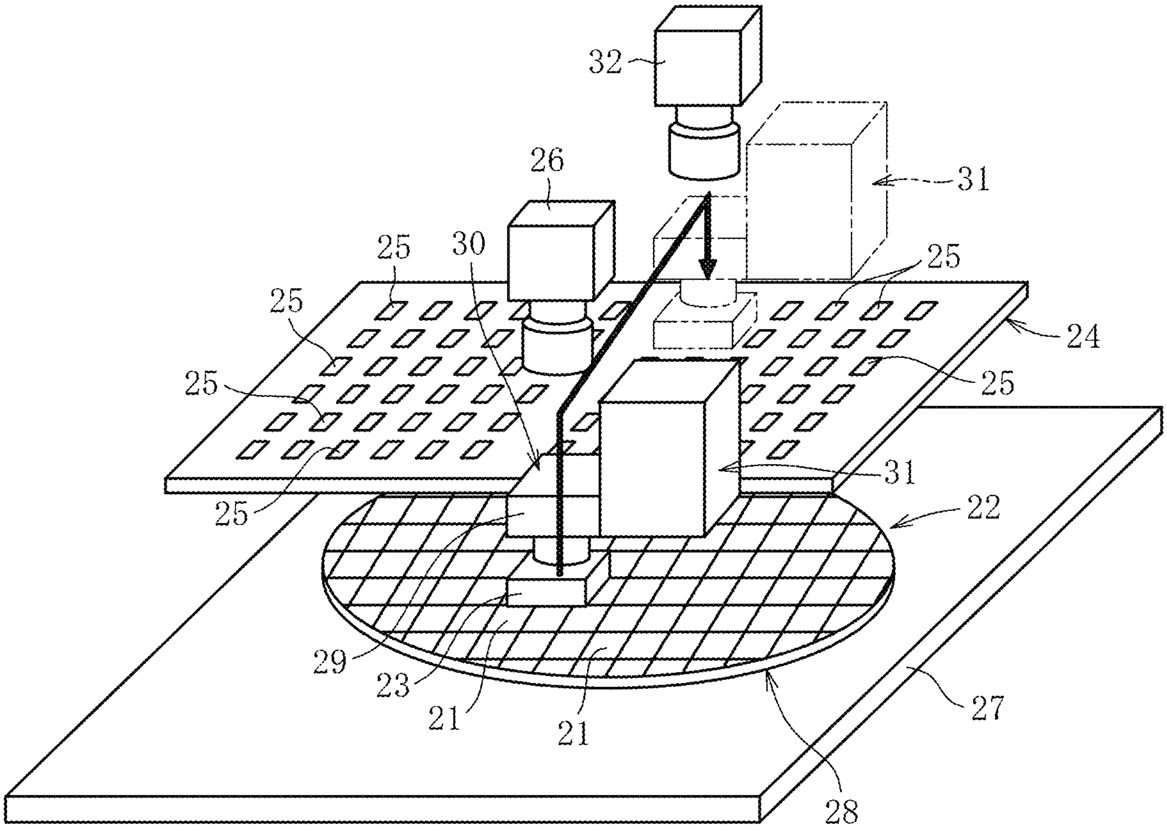
FIG. 2 is a schematic perspective view of a bonding device of the present invention.

FIG. 2 is an illustration of a bonding device comprising a position alignment device of the present invention. This bonding device is a device set in a die bonder configured to bond a die (a chip of a silicon substrate on which an electronic circuit is built) via an adhesive to a supplied-to member such as a lead frame or a substrate. In this embodiment, the adhesive is a die attach film (DAF) provided on a rear surface of the chip. The die attach film is an adhesive in the form of a film, and cures by being heated.

The bonding device comprises, as illustrated in FIG. 2, a bonding arm 30 (see FIG. 1) comprising a collet 23 configured to suction a semiconductor chip (hereinafter referred to as “chip 21”) at a pickup position P of a supply portion 22, a recognition camera 26 used to observe the chip 21 of the supply portion 22, and a recognition camera 32 used to observe an island portion 25 of a substrate 24, which is a supplied-to member, at a bonding position. That is, the recognition camera 26 forms a pickup-side imaging part 36 described later, and the recognition camera 32 forms a bonding-side imaging part 39 described later. The pickup position P is a site possessed by the chip 21 to be picked up.

The supply portion 22 has a semiconductor wafer 28 placed on and supported by a wafer support device 27. The semiconductor wafer 28 is divided into many chips which are each denoted by 21. The collet 23 is coupled to a collet holder 29, and the collet 23, the collet holder 29, and others form the bonding arm 30. The bonding arm 30 can move between a pickup position and a bonding position by means of a driver 31. The driver 31 can drive the bonding arm 30 in X-, Y-, θ-, and Z-directions.

Further, the collet 23 vacuum-suctions the chip 21 through a suction hole opened through a lower end surface of the collet 23, and the chip 21 adheres by suction to the lower end surface of the collet 23. When this vacuum suction (evacuation) is released, the chip 21 separates from the collet 23.

The substrate 24 is placed on a stage (not shown). A heating part (for example, a heater) is placed on the stage to heat the substrate 24. The substrate 24 is accordingly put in a high-temperature atmosphere. Once the substrate 24 reaches a predetermined temperature at which thermocompression bonding is executable, bonding of the chip 21 to the substrate 24 is performed, to thereby bond the chip 21 to the substrate via the die attach film.

A suction hole is formed in the stage, and a vacuum source such as a vacuum pump (not shown) is connected to the stage. A suction mechanism comprising the suction hole and the vacuum source serves as a fixing part configured to fix the substrate 24 to the stage. That is, when the vacuum source is driven with the substrate 24 placed on the stage, the substrate 24 is suctioned through the suction hole, and the entirety of the substrate 24 is stuck by suction (fixed) to the stage.

The recognition camera 26 is placed above the supply portion 22, and is used to observe the chip 21 to be picked up. The recognition camera 32 is placed above a bonding position Q, and is used to observe the island portion 25 of the substrate 24 that is to be subjected to bonding. Each of the recognition cameras 26 and 32 may be configured from, for example, a CCD camera or a CMOS camera.

Figure 3:
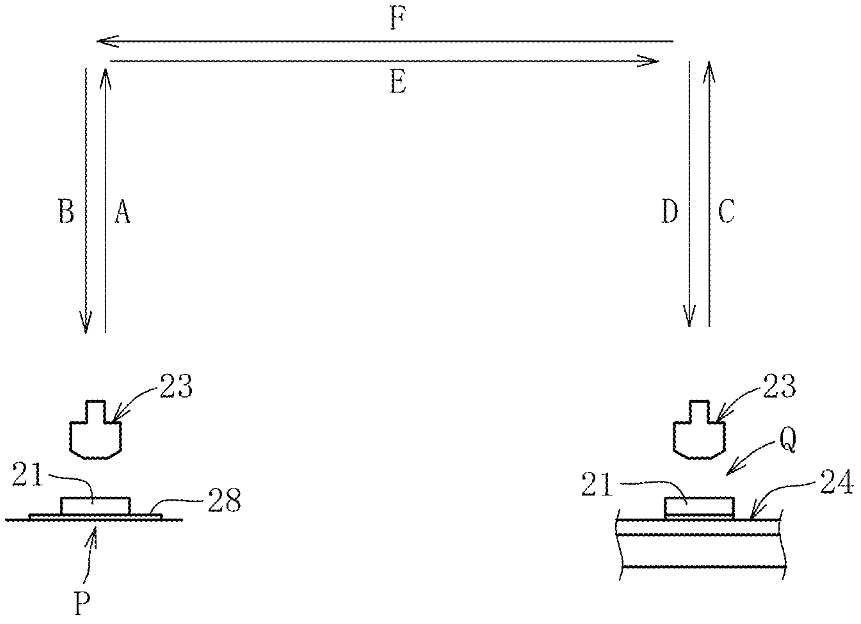
FIG. 3 is a schematic diagram for illustrating a bonding method.

Accordingly, this bonding the device uses recognition camera 26 placed above the pickup position P to observe the chip 21 to be picked up and, as illustrated in FIG. 3, positions the collet 23 above the chip 21 to be picked up, then moves the collet 23 downward as indicated by an arrow B, and picks up the chip 21. The collet 23 is then moved upward as indicated by an arrow A.

Next, the recognition camera 32 placed above the bonding position Q is used to observe the island portion 25 of the lead frame (substrate) 24 that is to be subjected to bonding, and, as illustrated in FIG. 3, the collet 23 is moved in a direction of an arrow E so as to be positioned above this island portion 25. The collet 23 is then moved downward as indicated by an arrow D to supply the chip 21 to this island portion 25. After supplying the chip 21 to the island portion 25, the collet 23 is moved upward as indicated by an arrow C, and is then returned to a stand-by position above the pickup position P as indicated by an arrow F.

As illustrated in FIG. 3, the bonding arm 30 enables the collet 23 to ascend in the direction of the arrow A and descend in the direction of the arrow B at the pickup position P, ascend in the direction of the arrow C and descend in the direction of the arrow D at the bonding position Q, and move back and forth in the directions of the arrows E and F between the pickup position P and the bonding position Q. The driver 31 is controlled by computerized control in movement indicated by the arrows A, B, C, D, E, and F. The driver 31 may be configured from a cylinder mechanism, a ball screw mechanism, a motor linear mechanism, or various other mechanisms, and an XYZθ-axis stage, a robot arm movable in X, Y, Z, and θ directions, or the like may be used.

In this case, the computer basically comprises an input part having an input function, an output part having an output function, a storage part having a storing function, a calculation part having a calculating function, and a controller having a control function. The input function enables information from an outside to be read into the computer. The read data and program are converted into signals in a format suitable for a computer system. The output function enables, for example, a result of calculation and stored data to be displayed on the outside. The storage part stores and saves, for example, a program, data, and a result of processing. The calculating function enables processing of data through a calculation or comparison in accordance with a command in the program. The control function enables the command in the program to be deciphered and an instruction to be issued to each of the parts. The control function enables overall control of all the parts of the computer. Examples of the input part include a keyboard, a mouse, a tablet, a microphone, a joystick, a scanner, and a capture board. Further, examples of the output part include a monitor, a speaker, and a printer. Examples of the storage part include a memory, a hard disk, a CD, a CD-R, a PD, and an MO. Examples of the calculation part include a CPU, and examples of the controller includes a CPU and a motherboard.

Figure 1:
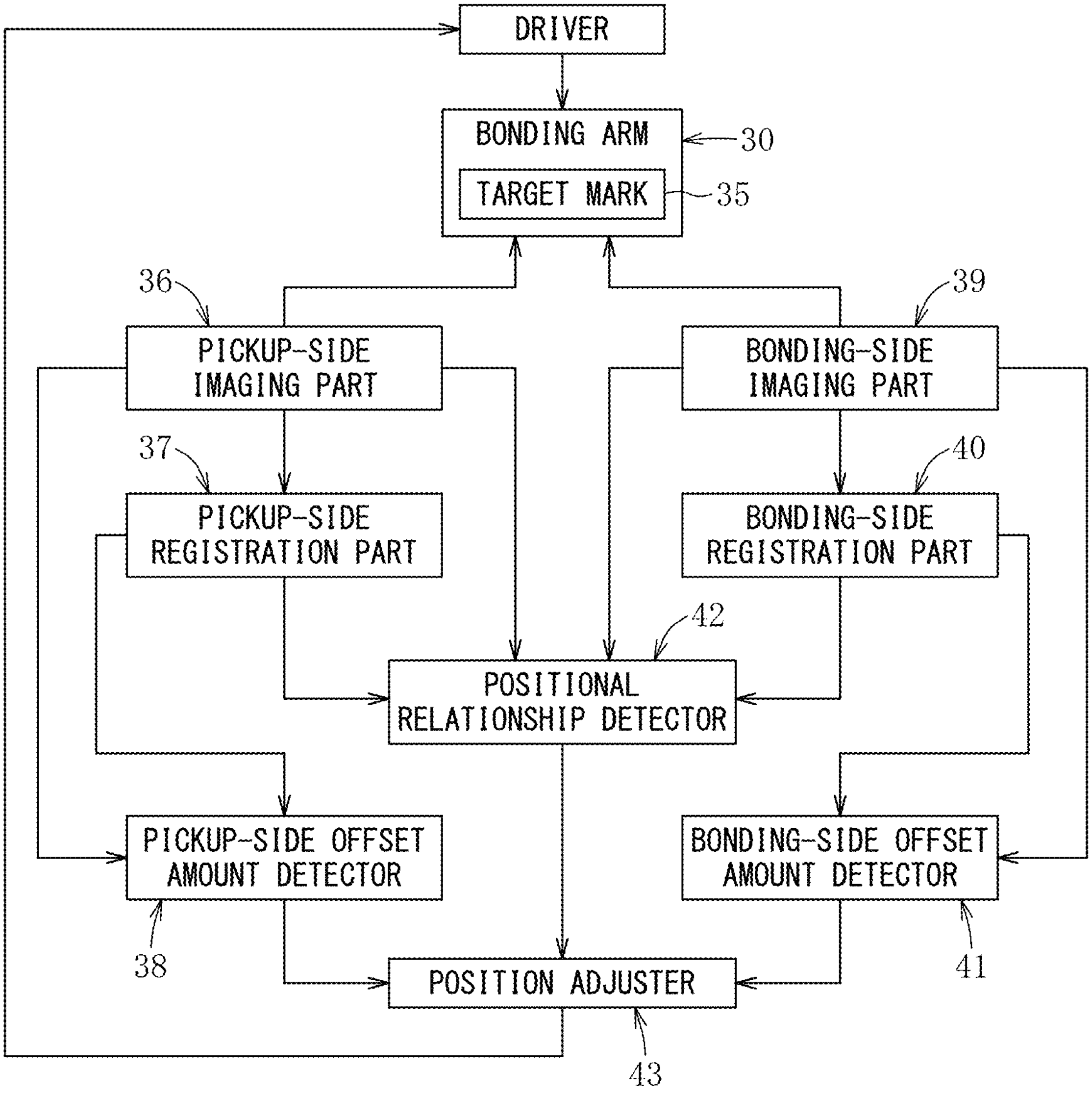
FIG. 1 is a schematic block diagram of a position alignment device of the present invention.

This position alignment device comprises, as illustrated in FIG. 1, a target mark 35 provided on the bonding arm 30, the pickup-side imaging part 36, a pickup-side registration part 37, a pickup-side offset amount detector 38, the bonding-side imaging part 39, a bonding-side registration part 40, a bonding-side offset amount detector 41, a positional relationship detector 42, and a position adjuster 43.

Figure 4:
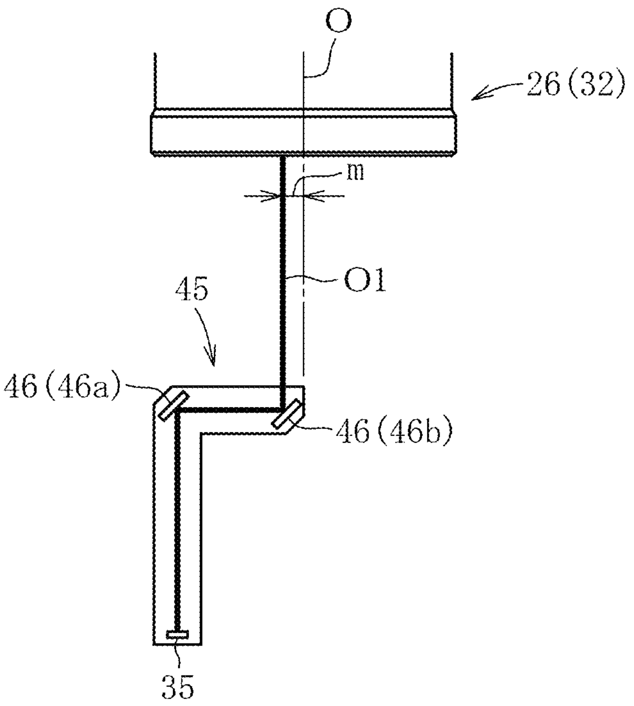
FIG. 4 is a schematic diagram for illustrating a relationship between a target mark and a camera of an imaging part.

The pickup-side imaging part 36 can be configured from the recognition camera 26, and the bonding-side imaging part 39 can be configured from the recognition camera 32. The target mark 35 is configured from, for example, a protruding piece or a concave portion, as a site colored in some manner. The target mark 35 in this case appears at a position offset from a center of a screen in each of a screen 50 of the camera 26 and a screen 51 of the camera 32. Accordingly, when the collet 23 attached to the bonding arm 30 is positioned above the pickup position P as illustrated in FIG. 4, an image of the target mark 35 as light reflected by the target mark 35 enters the recognition camera 26 at a position offset from a camera optical axis O of the recognition camera 26. Further, when the collet 23 attached to the bonding arm 30 is positioned above the bonding position Q, an image of the target mark 35 as light reflected by the target mark 35 enters the recognition camera 32 at a position offset from a camera optical axis O of the recognition camera 32.

As illustrated in FIG. 4, a light path changing mechanism 45 is provided in the bonding arm 30. The light path changing mechanism 45 is configured from, for example, a plurality of (two) reflective mirrors 46 (46*a* and 46*b*). The reflective mirrors can be substituted with prisms. A prism is an optical element for causing dispersion, refraction, total reflection, or birefringence of light, and is accordingly usable in place of a reflective mirror. The light path changing mechanism 45 corrects a light path length in order to bring the target mark 35 into focus.

Here, an offset amount "m" (see FIG. 4) which is an amount of offset of a registered position of the target mark 35 from a center in a taken image screen is outside at least a range of errors that occur due to design, manufacture, and assembly. That is, the offset amount "m" is larger than an amount of offset caused by those errors and, in each of the taken image screens 50 and 51, the amount of offset of the registered position of the target mark 35 from the center is set so as to be outside a tolerable range of errors of the device that occur when measures to prevent the registered position from being offset are taken. Accordingly, when a device is designed so as to prevent the registered position from being offset but the registered position in the assembled device is offset within a tolerable range of errors of the device, the device is not a device according to the present invention. A specific amount of offset from the center in each of the taken image screens can be, for example, about 4 mm. Conversely, even when the offset amount "m" is set to 4 mm, the registered position is tolerated to be offset within a range of errors that occur due to design, manufacture, and assembly. That is, in a case in which the offset amount is set to 4 mm but, after a device is assembled, the registered position is offset by an amount more than or less than 4 mm due to various errors, the device is a device according to the present invention. The center in the screen 50 or 51 is an intersecting point of diagonals of the screen 50 or 51.

The pickup-side registration part 37 registers the position of the target mark 35 on the screen 50 of the pickup-side imaging part 36 when the collet 23 attached to the bonding arm 30 is positioned above the pickup position P. That is, in a case in which the target mark 35 is at the registered position in an image of the target mark 35 taken by the pickup-side imaging part 36, the collet 23 is in a state of being positioned exactly above the pickup position P. Accordingly, the chip 21 located at the pickup position P can be picked up by moving the collet 23 in this state downward.

The bonding-side registration part 40 registers the position of the target mark 35 on the screen 51 of the bonding-side imaging part 39 when the collet 23 attached to the bonding arm 30 is positioned above the bonding position Q. That is, in a case in which the target mark 35 is at the registered position in an image of the target mark 35 taken by the bonding-side imaging part 39, the collet 23 is in a state of being positioned exactly above the bonding position Q. Accordingly, the chip 21 can be bonded at the bonding position Q by moving the collet 23 in this state downward.

The positional relationship detector 42 detects a relationship between coordinates of a target mark 35P of the screen 50 of the pickup-side imaging part 36 and coordinates of a target mark 350 of the screen 51 of the bonding-side imaging part 39.

The pickup-side offset amount detector 38 detects, in an image of the target mark 35 taken by the pickup-side imaging part 36, offset amount of the target mark 35 from the registered position of the target mark 35 that is registered by the pickup-side registration part 37.

The bonding-side offset amount detector 41 detects, in an image of the target mark 35 taken by the bonding-side imaging part 39, offset amount of the target mark 35 from the registered position of the target mark 35 that is registered by the bonding-side registration part 40.

The position adjuster 43 adjusts the bonding coordinates based on an offset amount detected by the pickup-side offset amount detector 38, an offset amount detected by the bonding-side offset amount detector 41, and the positional relationship detected by the positional relationship detector 42.

Incidentally, the pickup-side registration part 37, the bonding-side registration part 40, the positional relationship detector 42, the pickup-side offset amount detector 38, the bonding-side offset amount detector 41, the position adjuster 43, and other parts can be configured by the computer described above.

Figure 6:
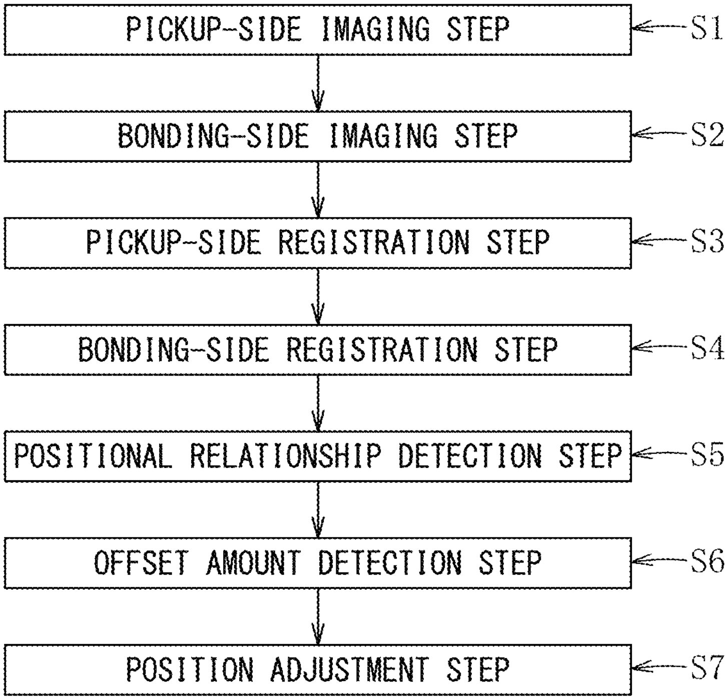
FIG. 6 is a process chart of the bonding method of the present invention.

Next, a method of manufacturing with use of the alignment device configured as described above is described. This positioning method comprises, as illustrated in FIG. 6, a pickup-side imaging step S1, a bonding-side imaging step S2, a pickup-side registration step S3, a bonding-side registration step S4, a positional relationship detection step S5, an offset amount detection step S6, and a position adjustment step S7.

First, in an initial state in which a side including the bonding arm 30 is not affected from heat, the pickup-side imaging step S1 in which the pickup-side imaging part 36 takes an image of the pickup position P and the bonding-side imaging step S2 in which the bonding-side imaging part 39 takes an image of the bonding position Q are executed. The pickup-side registration part 37 then stores coordinates of the target mark 35P on the screen 50 of the pickup-side imaging part 36 in the initial state. The bonding-side registration part 40 also stores coordinates of the target mark 350 on the screen 51 of the bonding-side imaging part 39 in the initial state.

Figure 5A:
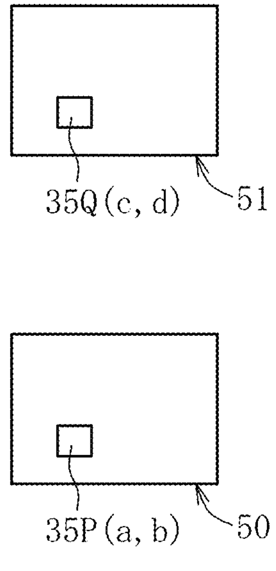
FIG. 5A is a diagram for illustrating a taken image screen of a pickup-side imaging part and a taken image screen of a bonding-side imaging part that indicate registered positions of the target mark.

In this case, as illustrated in FIG. 5A, the coordinates of the target mark 35P on the screen 50 are stored as (a, b), and the coordinates of the target mark 350 on the screen 51 are stored as (c, d). Thus, when the coordinates of the target mark 35P on the screen 50 are (a, b), the collet 23 attached to the bonding arm 30 is positioned above the chip 21 to be picked up, and can pick up this chip 21 with accuracy. When the coordinates of the target mark 350 on the screen 51 are (c, d), the chip 21 stuck by suction to the collet 23 attached to the bonding arm 30 is positioned above a position at which bonding is to take place, and this chip 21 can be bonded with accuracy.

The positional relationship detection step S5 in which the positional relationship detector 42 detects a positional relationship between the coordinates stored as the position of the target mark 35P on the screen 50 and the coordinates stored as the position of the target mark 350 on the screen 51 is then executed. This enables detection of a relationship between the coordinates on the respective screens. That is, when the target mark 35P on the screen 50 has coordinates (a, b), the target mark 350 on the screen 51 is given coordinates (c, d).

Under this settings, pickup operation in which the bonding arm 30 is driven so that the collet suctions the chip 21 to be picked up and bonding operation in which the bonding arm 30 is driven so that the picked-up chip 21 is bonded can be executed in order.

For each operation, the chip 21 to be picked up is observed with use of the recognition camera 26 placed above the pickup position P, and the island portion 25 of the lead frame (substrate) 24 to be subjected to bonding is observed with use of the recognition camera 32 placed above the bonding position Q.

Figure 5B:
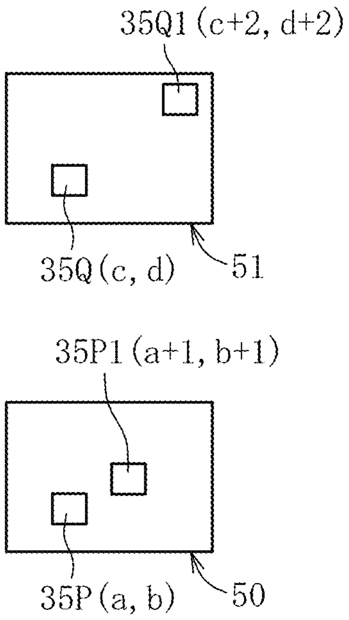
FIG. 5B is a diagram for illustrating a taken image screen of the pickup-side imaging part and a taken image screen of the bonding-side imaging part that indicate registered positions and detected positions of the target mark.

The observation may reveal that, as illustrated in FIG. 5B, the position of the target mark 35 is shifted to a position of 35P1 on the screen 50 of the pickup-side imaging part 36, and to a position of 35Q1 on the screen 51 of the bonding-side imaging part 39. In this case, the offset amount detection step S6 by the pickup-side offset amount detector 38 and the offset amount detection step S6 by the bonding-side offset amount detector 41 are executed.

That is, in the position alignment device according to the present invention, an image of the pickup position P can be taken by the pickup-side imaging part 36 and an image of the bonding position Q can be taken by the bonding-side imaging part 39. A mark position of the target mark 35 provided on the bonding arm 30 in the taken image screen 50 of the pickup-side imaging part 36 can be registered by the pickup-side registration part 37, and a mark position of the target mark 35 provided on the bonding arm 30 in the taken image screen 51 of the bonding-side imaging part 39 can be registered by the bonding-side registration part 40. Further, a positional relationship between the target mark position registered by the pickup-side registration part 37 and the target mark position registered by the bonding-side registration part 40 can be registered by the positional relationship detector 42. Further, the bonding coordinates can be adjusted by the position adjuster 43, based on the offset amount detected by the pickup-side offset amount detector 38 and the positional relationship detected by the positional relationship detector 42.

For example, when the target mark 35 is at a position of coordinates P (a, b) in relation to an origin (center: the intersecting point of diagonals of the screen 50) of the taken image screen 50 of the pickup-side imaging part 36, the collet 23 attached to the bonding arm 30 is successfully placed above the pickup position P and set so as to pick up an object (the chip 21) to be picked up. When the target mark 35 is at a position of coordinates Q (c, d) in relation to an origin (center: the intersecting point of diagonals of the screen 51) of the taken image screen 51 of the bonding-side imaging part 39, the collet 23 is successfully set so that an object (the chip 21) to be bonded is bonded.

Figure 5C:
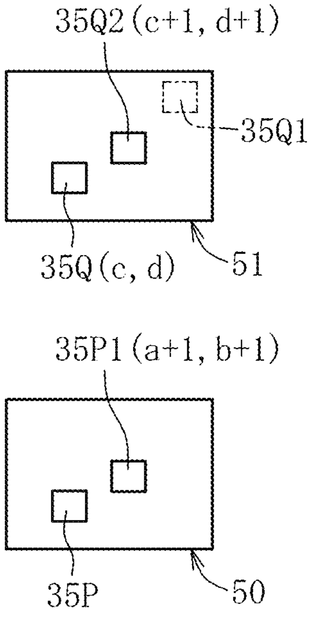
FIG. 5C is a diagram for illustrating a taken image screen of the pickup-side imaging part and a taken image screen of the bonding-side imaging part, with position alignment performed on the taken image screen of the bonding-side imaging part.

Further, as illustrated in FIG. 5A, the registered coordinates of the target mark 35 on the taken image screen 50 of the pickup-side imaging part 36 are P (a, b), and the registered coordinates of the target mark 35 on the taken image screen 51 of the bonding-side imaging part 39 are Q (c, d). In a case in which, as illustrated in FIG. 5B, the coordinates of the target mark 35 are P1 (a+1, b+1) in an image of the target mark 35 that is actually taken by the pickup-side imaging part 36, and are Q1 (c+2, d+2) in an image of the target mark 35 that is actually taken by the bonding-side imaging part 39, the position of the bonding arm 30 is adjusted so that, as illustrated in FIG. 5C, the target mark 35 is at Q2 (c+1, d+1) in the taken image screen 51 of the bonding-side imaging part 39. As a result of the adjustment, the target mark position in the taken image screen 50 on the pickup side and the target mark position in the taken image screen 51 on the bonding side are now offset by the same amount in the respective taken image screens. Accordingly, in a case in which the target mark position is offset by (+1, +1) in the pickup-side taken image screen, position alignment that causes the target mark position in the bonding-side taken image screen to be offset by (+1, +1) can be executed.

That is, in the above-mentioned case in which the coordinates of the target mark 35 in an image actually taken by the pickup-side imaging part 36 are offset from the registered coordinate position by (+1, +1), and the coordinates of the target mark 35 in an image actually taken by the bonding-side imaging part 39 are offset from the registered coordinate position by (+2, +2), the position of the target mark 35 on the bonding side is offset by an amount that is larger by (+1, +1) than on the pickup side. To adjust, the bonding-side coordinates are shifted by (−1, −1). Accordingly, when the registered coordinate position on the pickup side and the registered coordinate position on the bonding side differ from each other, that is, when the registered coordinates on the bonding side are Q (c, d) whereas the registered coordinates on the pickup side are P (a, b), adjustment can be made so that the pickup-side offset amount is reflected on the bonding-side offset amount.

Accordingly, irrespective of the pickup-side coordinates and the bonding-side coordinates at the time of registration, adjustment can be made so that the pickup-side offset amount is reflected on the bonding-side offset amount. That is, the bonding-side offset amount can be adjusted to the pickup-side offset amount. Thus, the position offset at the pickup position P can be reflected on the position offset at the bonding position Q, and the object (chip 21) picked up at the pickup position P can be bonded accurately and steadily at the bonding position Q.

According to the alignment device of the present invention, bonding operation (work) in a state in which a chip mounting position is misaligned can effectively be prevented, and highly accurate bonding operation (work) unaffected by thermal deformation of the bonding device is executable. Accordingly, position alignment can be executed accurately by simple processing without being affected by the thermal deformation. In the bonding device comprising this alignment device and in a bonding method that uses the alignment method, the collet 23 attached to the bonding arm 30 can accurately be aligned to a position above the bonding position Q by simple processing, and steady bonding operation (work) can be achieved.

Incidentally, in general (as a general rule), position alignment devices of the related art of this type are set so that the registered position of the target mark 35 is displayed at the center in the pickup taken image screen and the bonding taken image screen. Accordingly, the related art requires designing and assembly of relatively high accuracy. However, a position alignment device set so that the registered position can be shifted does not require such designing and assembly of high accuracy, and can improve productivity.

The bonding device of the present invention uses the collet 23 attached to the bonding arm 30 to pick up the chip 21 at the pickup position P, transports the picked-up chip 21 to the bonding position Q, and bonds the chip 21 at the bonding position Q, and comprises the position alignment device described above.

The bonding device of the present invention is capable of accurately aligning the collet 23 attached to the bonding arm 30 to a position above the bonding position Q by simple processing, and is accordingly capable of steady bonding operation (work).

According to the position alignment method of the present invention, an image of the pickup position P can be taken in the pickup-side imaging step S1, and an image of the bonding position Q can be taken in the bonding-side imaging step S2. Further, the mark position of the target mark 35 provided on the bonding arm 30 can be registered in the taken image screen of the pickup-side imaging part 36 in the pickup-side registration step S3, and the mark position of the target mark 35 provided on the bonding arm 30 can be registered in the taken image screen of the bonding-side imaging part 39 in the bonding-side registration step S4. Further, in the positional relationship detection step S5, the positional relationship between the target mark position registered in the pickup-side registration step S3 and the target mark position registered in the bonding-side registration step S4 can be registered. Further, in the position adjustment step S7, the bonding coordinates can be adjusted based on the offset amount detected in the pickup-side offset amount detector 38, the offset amount detected in the bonding-side offset amount detector 41, and the positional relationship detected in the positional relationship detection step S5.

As a position alignment method, position alignment is executable with use of the position alignment device. Accordingly, irrespective of the pickup-side coordinates and the bonding-side coordinates at the time of registration, adjustment can be made so that the pickup-side offset amount is reflected on the bonding-side offset amount. That is, the bonding-side offset amount can be adjusted to the pickup-side offset amount. Thus, the position offset at the pickup position P can be reflected on the position offset at the bonding position Q, and the object (chip 21) picked up at the pickup position P can be bonded accurately and steadily at the bonding position Q.

The bonding method comprises a pickup step in which the chip 21 is picked up at the pickup position P with the collet 23 attached to the bonding arm 30, a transportation step in which the chip 21 picked up in the pickup step is transported to the bonding position, and a bonding step in which the chip 21 is bonded at the bonding position Q, and uses the position alignment method described above to execute position alignment prior to the pickup step, or after a predetermined length of time passes since the pickup step.

According to the bonding method of the present invention, bonding operation (work) in a state in which the chip mounting position is misaligned can effectively be prevented, and highly accurate bonding operation (work) unaffected by thermal deformation of the bonding device is executable.

In the bonding method, position alignment is executable prior to the pickup step or after a predetermined length of time passes since start of the pickup step. In the case of execution prior to the pickup step, position alignment can be executed before the work of bonding the chip 21 to the island portion 25 of the substrate 24. In the case of execution after an elapse of the predetermined length of time, position alignment can be executed when position misalignment is surmised to have occurred due to heat caused as a result of executing the bonding work for the predetermined length of time.

A semiconductor device utilizing semiconductor characteristics can be manufactured by supplying the chip 21 to a supplied-to member (for example, the substrate 24) with the use of the alignment device described above. That is, a semiconductor device can be manufactured with the use of the position alignment device according to the present invention or the bonding device according to the present invention, and with the use of the position alignment method according to the present invention or the bonding method according to the present invention.

A high-quality electro-optical device, semiconductor circuit, or electronic device, or the like can accordingly be configured from the manufactured semiconductor device.

The present invention is not limited to the embodiment described above, and various modifications can be made thereto. For example, the position offset amount and the position offset direction vary depending on the material, size, and the like of a device. Incidentally, in one bonding device, a chip placed at a pickup position is picked up with a pickup collet, the chip stuck to the pickup collet by suction is supplied to an intermediate stage, the chip supplied onto the intermediate stage is picked up with a bonding collet, and the chip stuck to the bonding collet by suction is supplied to the bonding position. The alignment device according to the present invention may be applied to this type of bonding device.

In the embodiment described above, coordinate correction is executed when the coordinates of the registered target mark position on the pickup side and the coordinates of the registered target mark position on the bonding side indicate different positions. However, coordinate correction may be executed also when the former coordinates and the latter coordinates indicate the same position. Further, the offset amount in an actually taken image of the pickup side and the offset amount in an actually taken image of the bonding side are not limited to the amounts given in the embodiment.

REFERENCE SIGNS LIST

P pickup position
Q bonding position
S1 pickup-side imaging step
S2 bonding-side imaging step
S3 pickup-side registration step
S4 bonding-side registration step
S5 positional relationship detection step
S6 offset amount detection step
S7 position adjustment step
21 chip
23 collet
30 bonding arm
35 target mark
36 pickup-side imaging part
37 pickup-side registration part
38 pickup-side offset amount detector
39 bonding-side imaging part
40 bonding-side registration part
41 bonding-side offset amount detector
42 positional relationship detector
43 position adjuster
50, 51 screen

The invention claimed is:

1. A position alignment device, comprising:
a target mark provided on a bonding arm;
a pickup-side imaging part configured to take an image of a pickup position;
a bonding-side imaging part configured to take an image of a bonding position;
a pickup-side registration part configured to register a target mark position in a taken image screen of the pickup-side imaging part;
a bonding-side registration part configured to register a target mark position in a taken image screen of the bonding-side imaging part;
a positional relationship detector configured to detect a positional relationship between the target mark position registered by the pickup-side registration part and the target mark position registered by the bonding-side registration part;
a pickup-side offset amount detector configured to detect an offset amount of offset between a target mark position in an image taken by the pickup-side imaging part and the target mark position registered by the pickup-side registration part;
a bonding-side offset amount detector configured to detect an offset amount of offset between a target mark position in an image taken by the bonding-side imaging part and the target mark position registered by the bonding-side registration part; and
a position adjuster configured to adjust the bonding position, based on the offset amount detected by the pickup-side offset amount detector, the offset amount detected by the bonding-side offset amount detector, and the positional relationship detected by the positional relationship detector,
wherein the registered target mark position is displayed at a position offset from a center in a pickup taken image screen, and the registered target mark position is displayed at a position offset from a center in a bonding taken image screen.

2. The position alignment device according to claim 1, wherein, in each of the taken image screens, an offset amount of offset of the registered target mark position from the center is set so as to be outside a tolerable range of errors of the position alignment device that occur when measures to prevent the registered target mark position from being offset are taken.

3. A bonding device configured to:
pick up a chip at a pickup position with a collet attached to a bonding arm;
transport the picked-up chip to a bonding position; and
bond the chip at the bonding position,
the bonding device comprising the position alignment device of claim 1.

4. A position alignment method, comprising:
a pickup-side imaging step of taking an image of a pickup position;

a bonding-side imaging step of taking an image of a bonding position;

a pickup-side registration step of registering a mark position of a target mark provided on a bonding arm in a taken image screen of the image taken in the pickup-side imaging step;

a bonding-side registration step of registering a mark position of the target mark provided on the bonding arm in a taken image screen of the image taken in the bonding-side imaging step;

a positional relationship detection step of detecting a positional relationship between a target mark position registered in the pickup-side registration step and a target mark position registered in the bonding-side registration step;

a pickup-side offset amount detection step of detecting an offset amount of offset between a target mark position in the image taken in the pickup-side imaging step and the target mark position registered in the pickup-side registration step;

a bonding-side offset amount detection step of detecting an offset amount of offset between a target mark position in the image taken in the bonding-side imaging step and the target mark position registered in the bonding-side registration step; and a position adjustment step of adjusting the bonding position, based on the offset amount detected in the pickup-side offset amount detection step, the offset amount detected in the bonding-side offset amount detection step, and the positional relationship detected in the positional relationship detection step, wherein the registered target mark position is displayed at a position offset from a center in a pickup taken image screen, and the registered target mark position is displayed at a position offset from a center in a bonding taken image screen.

5. A method of manufacturing a semiconductor device, comprising supplying a chip to a supplied-to member to manufacture a semiconductor device that functions by utilizing semiconductor characteristics, wherein the method uses the position alignment device of claim 1.

6. A method of manufacturing a semiconductor device, comprising supplying a chip to a supplied-to member to manufacture a semiconductor device that functions by utilizing semiconductor characteristics, wherein the method uses the position alignment method of claim 4.

7. A bonding method, comprising:

a pickup step of picking up a chip at a pickup position with a collet attached to a bonding arm;

a transportation step of transporting the chip picked up in the pickup step to a bonding position; and a bonding step of bonding the chip at the bonding position, wherein, prior to the pickup step, or after a predetermined length of time passes since the pickup step, position alignment is executed by using the position alignment method of claim 4.

* * * * *